US005112932A

United States Patent [19]

Koenig et al.

[11] Patent Number: 5,112,932

[45] Date of Patent: May 12, 1992

[54] EPOXY-TERMINATED POLYOXAZOLIDONES AND PROCESS FOR THE PREPARATION THEREOF

[75] Inventors: Raymond A. Koenig, Vendenheim; Joseph Gan, Strasbourg, both of France

[73] Assignee: The Dow Chemical Company, Midland, Mich.

[21] Appl. No.: 531,963

[22] Filed: Jun. 1, 1990

[30] Foreign Application Priority Data

Jun. 6, 1989 [GB] United Kingdom ................. 8912952

[51] Int. Cl.[5] .............................................. C08G 18/58

[52] U.S. Cl. ........................................ 528/51; 528/52; 528/73

[58] Field of Search .............................. 528/51, 52, 73

[56] References Cited

U.S. PATENT DOCUMENTS 3,694,406 9/1972 D'Alelio .............................. 528/51
3,767,624 10/1973 Clarke .................................. 528/73

FOREIGN PATENT DOCUMENTS 1045804 10/1966 United Kingdom .
2093035 8/1982 United Kingdom .

*Primary Examiner*—Maurice J. Welsh
*Assistant Examiner*—Rachel Johnson

[57] ABSTRACT

Epoxy-terminated polyoxazolidone having from about 5 to about 30 weight percent of the isocyanate content are described. These polyoxazolidone are prepared by a process in which various process parameters are controlled in a targeted manner to give a product having from about 50 to about 100 percent of isocyanate groups converted to oxazolidone rings and from about 0 to about 50 percent of the isocyanate groups converted to isocyanurate rings. These epoxy terminated polyoxazolidones exhibit high glass transition temperatures and high resistance to chemicals when cured. They are useful for the preparation of electrical laminates, particularly laminates used in the preparation of electrical circuit boards.

24 Claims, No Drawings

EPOXY-TERMINATED POLYOXAZOLIDONES AND PROCESS FOR THE PREPARATION THEREOF

BACKGROUND OF THE INVENTION

The present invention relates to isocyanate modified epoxy resins (epoxy-terminated polyoxazolidones) having from about 5 to about 30 weight percent of the isocyanate content wherein from about 0 to about 50 percent of the isocyanate groups are converted to isocyanurate rings and from about 50 to about 100 percent of the isocyanate groups are converted to oxazolidone (commonly referred to in the past as "2-oxazolidinone") rings and a process for the preparation thereof. The present invention also relates to epoxy resin varnish compositions containing these isocyanate modified epoxy resins and electrical laminates prepared therefrom.

The synthesis and properties of isocyanate modified epoxy compounds which are copolymers of polyisocyanates and polyepoxides have attracted a great deal of interest in recent years. Various isocyanate modified epoxy compounds are described as promising engineering materials for the manufacture of a wide variety of useful products including rigid foams, thermoplastics, coatings, adhesives and elastomers.

During the reaction of a polyepoxide with a polyisocyanate there is competition between formation of 2-oxazolidone rings and isocyanurate rings. The cross-linking density and branching of the formed polymer compound increases with increased content of isocyanurate rings and thereby the glass transition temperature (Tg) of the polymer is raised. Many studies have shown that many factors such as reaction temperature, nature of the catalyst, relative amounts of the reactants and solvents employed, influence the reaction and formation of 2-oxazolidone rings and isocyanurate rings. See, for example, Kinjo et al, *Polymer Journal Vol.* 14, No. 6, 505–507 (1982); Sandler, S. R., *Journal of Polymer Science*, A 1-5, 1481 (1967); Sayigh and Ulrich, *J. Chem. Soc.*, 1961, 3148–51; Uribe and Hodd, *Polym. Sci. Technical*, 31, 251–73 (1985); Kordomenos et al, *Macromolecules*, 14, 1434–37 (1981); Kitayana et al, *Rubber Chemistry and Technology*, Vol. 53, 1–6 (1980); Herweh et al, *Tetrahedron Letters*, No. 12, 809–812 (1971); Dileone, *J. Polymer Sci.*, A 1-8, 609–615 (1970); Herweh et al, *J. Org. Chem.*, Vol. 33, 1409–23 (1968) and Sandler, *J. Polym. Sci.*, A1-5, 1481 (1967). For convenience most of this fundamental studies were conducted with model compounds in dilute solutions particularly in dimethylformamide (DMF).

In general it has been found that epoxides promote formation of isocyanurate rings at low temperature. It has been shown that isocyanurate rings are formed from the isocyanate groups by the catalytic effects of nucleophilic compounds at temperatures below 100° C. and are converted into oxazolidone rings at temperature above 110° C. in the presence of DMF solvent. It has been disclosed that the usual reaction temperature to form oxazolidone rings is about 150° C. to 160° C. (boiling temperature of DMF solvent).

There are three end products which can be obtained in the condensation reaction of polyisocyanates with polyfunctional epoxides. The reactants' stoichiometry (ratio of epoxide groups to isocyanate groups) determines the various end products, their remaining end groups and their possible uses. These condensation products are conventionally referred to as polyoxazolidones.

Isocyanate-terminated polyoxazolidones, are prepared using a stoichiometric excess of the polyisocyanate (isocyanate/epoxide ratio greater than 1) in the presence of a suitable catalyst. The following catalysts have been reported to promote the formation of isocyanate-terminated polyoxazolidones: quaternary ammonium salts, diethylzinc, zinc chloride/trimethylamine complex and organoantimony iodide. See, for example, Sander, *J. Polym. Sci.*, A 1-5, 1481 (1967); Kordomenos et al, *Journal of Coating Technology*, 55, No. 700, pp. 49 and 59 (1983); U.S. Pat. No. 4,022,721 to Mitsubishi; and PCT Patent Application WO/US 86/06734 to Dow. Isocyanate-terminated polyoxazolidones are reported to be suitable for use as resins, elastomers, paints and adhesives. The isocyanate-terminated polyoxazolidones can be further cross-linked via the catalytic trimerization of the terminal isocyanate groups to isocyanurate rings.

Linear high molecular weight polyoxazolidones are prepared using stoichiometric amounts (isocyanate/epoxide ratio=1) of a diepoxy compound and diisocyanate compound.

Another class of resins (often referred to as "ISOX" resin) contain both isocyanurate and oxazolidone rings but the isocyanurate rings are predominant. The mechanical properties of ISOX resins can be varied from hard to flexible by changing equivalent ratio of isocyanate and epoxide groups. See, for example, Kinjo et al, *Polymer Journal, Vol.* 14, No. 6, 505–507 (1982). This reference describes preparation of a series of thermosetting ISOX resins in which diphenylmethane-4,4'-diisocyanate (MDI) was reacted with different diepoxides in the presence of ethyl-methyl imidazole as a catalyst and as a curing agent. ISOX resin is low viscosity liquid at room temperature before curing. Compared with other conventional heat resistant solventless varnishes, ISOX resin are reported to have greater mechanical strength at elevated temperatures, and goods heat, electrical, chemical and moisture resistance properties.

U.S. Pat. No. 4,070,416 (Hitachi Ltd.) describes a process for producing thermosetting resins by mixing one equivalent or more of polyfunctional isocyanate per one equivalent of a polyfunctional epoxide in the presence of a tertiary amine, morpholine derivatives or imidazole as catalysts. The catalyst is used within a range of 0.1 to 2 weight percent, based on the combined weight of the reactants. The reaction temperature of 130° C. or lower is said to result in the formation of mainly isocyanurate rings, whereas it is assumed that oxazolidone rings should be mainly formed at temperature above 130° C. The produced resins are said to exhibit excellent electrical and mechanical properties and high thermal stability. The produced resins are said to have various applications as heat resistance insulation varnishes, casting resins, impregnation resins, molding resins for electrical parts, adhesives, resins for laminating boards, resins for printed circuits etc.

Epoxy-terminated polyoxazolidones are prepared by reacting an epoxy resin with a polyisocyanate compound using stoichiometric excess of epoxy resin (isocyanate/epoxide ratio lower than 1). The following catalysts have been described in the literature to promote formation of epoxy-terminated polyoxazolidones: quaternary ammonium salts, HEXA (hexamethylenetetramine), diazabicyclooctane (sold by Air Product under the trademark DABCO), diethylzinc and organoantimony iodide. See, for example Sander et al, *J. Appl. Polymer Sci.*, 9, 1984–1996 (1965); Uribe et al, *Polym. Sci. Technical*, 31, 251–73 (1985); Kordomenos et al, *Journal of Coating Technology*, 55, No. 700, pp. 49 and 59 (1983); and PCT Patent Application WO/US 8606734. The epoxy-terminated polyoxazolidones can be cured with conventional epoxy hardeners. The cured epoxy resin exhibit very good thermal properties and solvent stability and have generally good impact properties. The epoxy-terminated polyoxalidones are reported to be useful for the preparation of coatings resins and adhesives.

European Patent Application No. 0113575A discloses powder coating compositions comprising epoxy-terminated polyoxazolidone resins prepared by reacting a diepoxide and a diisocyanate in amounts which provide a ratio of epoxide equivalents to isocyanate equivalents of from about 1.1:1 to about 10:1 and curing agents. The polyoxazolidone resins are said to have comparatively high glass transition temperatures and provide coatings of improved resistance to cathodic disbandment. The coating composition are applied by fluidized bed sintering or electrostatic spray methods.

Self thermosetting compositions of polyisocyanates and polyepoxides are described in U.S. Pat. Nos. 4,564,651 and 4,631,306 (both to Markert et al) which discloses a method for the preparation of reaction resin molded materials and molded materials for insulating components, respectively containing oxazolidone and isocyanurate rings by mixing a polyepoxide and a polyisocyanate to from a resin mixture having a viscosity up to 7000 mPa.s at 25° C. and the mole ratio of epoxy to isocyanate groups of from about 1:1 to about 5:1; reacting the resin mixture in the presence of an imidazole or tertiary amine catalyst at elevated gelling temperature of from 80° C. to 130° C. to form a cross-linked polymer; and heating the cross-linked polymer to from about 130° C. to about 200° C. to cause posthardening and produce a molded material. The molded materials are reported to exhibit improved mechanical properties.

U.S. Pat. No. 3,334,110 (Schramm) discloses a method for preparing epoxy-terminated polyoxazolidones by reacting a polyisocyanate with a polyepoxide in the presence of a catalyst mixture comprising an alcohol and tertiary amine or a quaternary ammonium salt. The epoxy-terminated polyoxazolidones can be cured with epoxy curing catalysts or reacted with epoxy hardeners to give a variety or products useful in the fields of coatings, laminating, bonding, molding, foams etc.

U.S. Pat. No. 4,066,628 (Ashida et al) discloses a process for preparing polyoxazolidones by reacting an organic isocyanate with an epoxide in the presence of dialkyl zinc, zinc carboxylate, organozinc chelate compound or trialkyl aluminum as the catalyst. Polyoxazolidones prepared by this process are useful starting materials for the manufacture of a wide variety of products including foams, coatings, adhesives, elastomers and the like.

Although numerous processes for the preparation of polyoxazolidones are described in the literature and various catalysts are used in these processes, only polyoxazolidones having fixed product specifications are produced. None of the known processes allows for the preparation of epoxy-terminated polyoxazolidones in controlled manner by manipulating various process parameters. None of the known processes provides for producing epoxy-terminated polyoxazolidones which will have particularly desired physical and mechanical properties by controlling the content of the oxazolidone and isocyanurate rings incorporated in the epoxy-terminated polyoxazolidone in order to accommodate desired end use of the polyoxazolidone. Furthermore, none of the known art discloses nor suggests that imidazole compounds would be useful as catalysts in a process for the preparation of epoxy-terminated polyoxazolidones. Moreover, there is no disclosure nor suggestion in the known art that epoxy-terminated polyoxazolidones would be useful materials for the preparation of electrical laminates and in particular, for the preparation of electrical circuit boards.

Heretofore electrical laminates have been conventionally prepared from bisphenol A based epoxy resins advanced with either bisphenol A or tetrabromobisphenol A and cured with a biguanide such as dicyanodiamide. However, for many applications, such as multilayered printed circuit boards, the glass transition temperature (Tg) of the cured epoxy resins is undesirably low, for example, less than 135° C. and the chemical resistance of the cured epoxy resins is also undesirably low, for example, N-methylpyrrolidone pick-up is greater than 0.5 weight percent. Although in many applications these physical properties are acceptable, for many applications it is desirable to have cured epoxy resins which have glass transition temperature above 135° C. and chemical resistance such as N-methylpyrrolidone pick-up of less than 0.1 weight percent. There are available specialty epoxy resins and other resinous products which meet the desired higher standards but their use is limited due to the economics. In particular, the cost associated with these resins precludes them from being used in the most of the applications associated with electrical circuit boards.

There is a need in industry for a process which will allow for the preparation or epoxy-terminated polyoxazolidones in a targeted manner by controlling various process parameters to obtain materials having physical and mechanical properties targeted to specific, desired end uses of such materials.

There is also a great need for engineering materials which will have the desired physical and mechanical properties (particularly, sufficiently high Tg's and chemical resistance properties) and still be inexpensive enough to be used in the most of the electrical laminate applications, particularly in electrical circuit board applications.

The present invention provides such engineering materials which materials have physical and mechanical properties targeted to specific end uses. Moreover, the present invention provides a process for the preparation of these engineering materials which process can be controlled in a targeted manner by manipulating various process parameters.

SUMMARY OF THE INVENTION

The present invention concerns a process for the preparation of an epoxy-terminated polyoxazolidone (isocyanate modified epoxy resin) which process comprises reacting a polyepoxide compound with a polyisocyanate compound in the presence of a catalyst for the reaction of the epoxy and isocyanate groups at an elevated temperature, said process being characterized by (A) adding (1) from about 5 to about 30, preferably from about 5 to about 20, most preferably from about 10 to about 20, weight percent of the polyisocyanate compound within a period of time of from about 3 about 90, preferably from about 15 to about 60, most preferably from about 20 to about 45, minutes to (2) a mixture comprising (a) from about 70 to about 95, preferably from about 80 to about 95, most preferably from about 80 to about 90, weight percent of the polyepoxide compound and (b) from about 0.01 to about 2, preferably from about 0.02 to about 1, most preferably from about 0.02 to about 0.1, weight percent of the catalyst, said weight percentages being based on the combined weight of the polyepoxide compound and polyisocyanate compound; and (B) heating the reaction mixture obtained in step A to a temperature of from about 110° C. to about 200° C., preferably from about 120° C. to about 180° C., most preferably from about 140° C. to about 160° C., for a period of time from about 5 to about 180, preferably from about 30 to about 120, most preferably from about 60 to about 90, minutes; and further characterized in that the conversion of isocyanate groups to the oxazolidone and isocyanurate rings is controlled in any of the following manner:

(i) by increasing the reaction temperature at a given amount of the catalyst and a given amount of the polyisocyanate compound used when higher conversion to oxazolidone rings is desired; or (ii) by increasing the amount of the catalyst at a given reaction temperature and a given amount of the polyisocyanate compound used when higher conversion to oxazolidone rings is desired; or (iii) by increasing the amount of the polyisocyanate used at a given amount of the catalyst and a given reaction temperature when higher conversion to isocyanurate rings is desired; or (iv) by increasing the rate of addition of the polyisocyanate compound at a given reaction temperature, given amount of the catalyst and given amounts of the polyepoxide and polyisocyanate compounds when higher conversion to isocyanurate rings is desired; whereby the epoxy-terminated polyoxazolidone having from about 50 to about 100 percent of the original isocyanate groups converted to oxazolidone rings and from about 0 to about 50 percent of the original isocyanate groups converted to isocyanurate rings is obtained.

In another aspect, the present invention concerns the epoxy-terminated polyoxazolidone having from about 5 to about 30 preferably from about 5 to about 20, most preferably from about 10 to about 20 weight percent of the isocyanate content and having from about 50 to about 100 percent of the original isocyanate groups converted to oxazolidone rings and from about 0 to about 50 percent of the original isocyanate groups converted to isocyanurate rings whenever prepared according to the aforementioned process.

Yet in another aspect, the present invention concerns an epoxy resin varnish composition comprising an epoxy resin, a hardener for the epoxy resin, an organic solvent, an accelerator and, optionally, other conventional adjuncts, characterized in that said epoxy resin is the epoxy-terminated polyoxazolidone prepared by the process described hereinbefore.

Still in another aspect, the present invention concerns a process for preparing electrical laminates comprising the steps of:

(a) impregnating a reinforcing web with an epoxy resin varnish comprising an epoxy resin, a hardener for the epoxy resin, an organic solvent and an accelerator;

(b) heating the so prepared prepreg to a temperature sufficient to partially react the epoxy component of the varnish with the hardener component; and (c) laminating one or more layers of the prepreg with an electrically conductive material and heating the so formed laminate at an elevated pressure and to elevated temperatures, characterized in that the epoxy resin varnish is the aforementioned epoxy resin varnish composition in which the epoxy component is the epoxy-terminated polyoxazolidone having from about 5 to about 30, preferably from about 5 to about 20, most preferably from about 10 to about 20, weight percent of the isocyanate content and having from about 50 to about 100 percent of the original isocyanate groups converted to the oxazolidone rings and from about 0 to about 50 percent of original isocyanate groups converted to isocyanurate rings.

Yet in another aspect, the present invention concerns an electrical laminate prepared according to the above process.

DETAILED DESCRIPTION OF THE PREFERRED EMBODIMENT

The polyepoxide compound useful in the practice of the present invention is suitably a compound which possesses more than one 1,2-epoxy group. In general, the polyepoxide compound is saturated or unsaturated aliphatic, cycloaliphatic, aromatic or heterocyclic compound which possesses more than one 1,2-epoxy group. The polyepoxide compound can be substituted with one or more substituents which are non-reactive with the isocyanate groups such as lower alkyls and halogens. Such polyepoxide compounds are well known in the art. Illustrative polyepoxide compounds useful in the practice of the present invention are described in the *Handbook of Epoxy Resins* by H. E. Lee and K. Neville published in 1967 by McGraw-Hill, New York and U.S. Pat. No. 4,066,628.

Particularly useful polyepoxide compounds which can be used in the practice of the present invention are polyepoxides having the following general formula

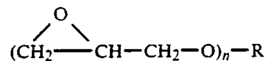

wherein R is substituted or unsubstituted aromatic, aliphatic, cycloaliphatic or heterocyclic polyvalent group and n has an average value of from greater than about 1 to less than about 5. The preferred diepoxides include diglycidyl ether of 2,2-bis(4-hydroxyphenyl) propane (generally referred to as bisphenol A) and diglycidyl ether of 2,2-bis(3,5-dibromo-4-hydroxyphenyl) propane (generally referred to as tetrabromobisphenol A). Mixtures of any two or more polyepoxides can also be used in the practice of the present invention.

The polyisocyanate compound useful in the practice of the present invention is represented by the following general formula:

$$(O{=}C{=}N)_m{-}R'$$

wherein R′ is substituted or unsubstituted aliphatic, aromatic or heterocyclic polyvalent group and m has an average value of greater than about 1 to less than about 5, preferably from about 1.5 to about 4, most preferably from about 2 to about 3. Examples of suitable polyisocyanates include 4,4′-methylene bis(phenylisocyanate)

(MDI) and isomers thereof, higher functional homologs of MDI (commonly designated as "polymeric MDI"), toluene diisocyanate (TDI) such as 2,4-toluene diisocyanate and 2,6-toluene diisocyanate, m-xylylene diisocyanate, hexamethylene diisocyanate (HMDI) and isophoronediisocyanate. Mixtures of any two or more polyisocyanates can also be used in the practice of the present invention. Other suitable polyisocyanate compounds are described in U.S. Pat. Nos. 3,313,747; 4,066,628 and 4,742,146.

Preferred polyisocyanate compounds are 4,4'-methylene bis(phenylisocyanate) (MDI) and isomers thereof, polymeric MDI and toluene diisocyanate (TDI). The most preferred polyisocyanate compounds are 4,4'-methylene bis(phenylisocyanate), isomers thereof and polymeric MDI.

A suitable catalyst is employed in the practice of the present invention to facilitate reaction of the polyepoxide compound with the polyisocyanate compound. Examples of suitable catalysts include zinc carboxylate, organozinc chelate compound, trialkyl aluminum, quaternary phosphonium and ammonium salts, tertiary amines and imidazole compounds. The preferred catalysts are imidazole compounds. Particularly, preferred catalysts are 2-phenylimidazole 2-methylimidazole, 1-methylimidazole, 2-ethyl-4-methylimidazole and 4,4'-methylene-bis(2-ethyl-5-methylimidazole).

The catalyst is generally employed in an amount of from about 0.01 to about 2; preferably from about 0.02 to about 1, most preferably from about 0.02 to about 0.1, weight percent based on the combined weight of the polyepoxide compound and polyisocyanate compound used.

In the practice of the present invention, an epoxy-terminated polyoxazolidone containing from about 50 to about 100 percent of the isocyanate groups converted to oxazolidone rings and from about 0 to about 50 percent of the isocyanate groups converted to isocyanurate rings is produced by reaction of the polyisocyanate compound with the polyepoxide compound in the presence of a suitable catalyst at elevated temperatures.

The polyisocyanate compound is employed in an amount of from about 5 to about 30, preferably from about 5 to about 20, most preferably from about 10 to about 20, weight percent, the weight percent being based on the combined weight of the polyepoxide and polyisocyanate reactants.

The polyepoxide compound is employed in an amount of from about 70 to about 95, preferably from about 80 to about 95, most preferably from about 80 to about 90, weight percent, the weight percent being based on the combined weight of the polyepoxide and polyisocyanate reactants.

The reaction of the polyepoxide with the polyisocyanate is conducted at a temperature of from about 110° C. to about 200° C. Preferably, the reaction is conducted at a temperature of from about 120° C. to about 180° C. Most preferably, the reaction is conducted at a temperature of from about 140° C. to about 160° C.

In the practice of the present invention the catalyst is added to the reaction vessel containing the polyepoxide prior to the start of the addition of polyisocyanate compound. The catalyst can be dissolved in a suitable solvent prior to the addition to the polyepoxide to improve homogenization if desired. The temperature at which the catalyst is added is not critical. In general the catalyst is added at a temperature lower than the reaction temperature. The temperature is then raised and the reaction temperature maintained while the controlled addition of the polyisocyanate to the mixture of the catalyst and the polyepoxide is started. The polyisocyanate is added to the reaction vessel within a period of time of from about 3 to about 90, preferably from about 15 to about 60, most preferably from about 20 to about 45, minutes while maintaining the reaction temperature. The reaction temperature is maintained after the complete addition of the polyisocyanate for a period of time of from about 5 to about 180, preferably from about 15 to about 120, most preferably from about 30 to about 90 minutes.

In general, the reaction of the polyepoxide compound and the polyisocyanate compound according to the process of the present invention is conducted neat, that is, in the absence of a solvent or other liquid reaction diluent.

In the practice of the present invention it has been surprisingly found that the conversion of the isocyanate groups can be controlled in a targeted manner to obtain the epoxy-terminated polyoxazolidone having from about 5 to about 30, preferably from about 5 to about 20, most preferably from about 10 to about 20, weight percent of the isocyanate content and having from about 50 to about 100 percent of the original isocyanate groups converted to oxazolidone rings and from about 0 to about 50 percent of the original isocyanate groups converted to isocyanurate rings in any of the following manner:

(i) at a given amount of the catalyst and a given amount of the polyisocyanate, higher conversion of the isocyanate groups to oxazolidone rings (up to about 100 percent conversion) is achieved by increasing the reaction temperature; or (ii) at a given amount of the polyisocyanate and a given reaction temperature, higher conversion of the isocyanate groups to oxazolidone rings (up to about 100 percent conversion) is achieved by increasing the amount of the catalyst; or (iii) at a given amount of the catalyst and a given reaction temperature, higher conversion of the isocyanate groups to isocyanurate rings (up to about 50 percent conversion) is achieved that is, in the absence of a solvent or other liquid reaction diluent.

In the practice of the present invention it has been surprisingly found that the conversion of the isocyanate groups can be controlled in a targeted manner to obtain the epoxy-terminated polyoxazolidone having from about 5 to about 30, preferably from about 5 to about 20, most preferably from about 10 to about 20, weight percent of the isocyanate content and having from about 50 to about 100 percent of the original isocyanate groups converted to oxazolidone rings and from about 0 to about 50 percent of the original isocyanate groups converted to isocyanurate rings in any of the following manner:

(i) at a given amount of the catalyst and a given amount of the polyisocyanate, higher conversion of the isocyanate groups to oxazolidone rings (up to about 100 percent conversion) is achieved by increasing the reaction temperature; or (ii) at a given amount of the polyisocyanate and a given reaction temperature, higher conversion of the isocyanate groups to oxazolidone rings (up to about 100 percent conversion) is achieved by increasing the amount of the catalyst; or (iii) at a given amount of the catalyst and a given reaction temperature, higher conversion of the isocyanate groups to isocyanurate rings (up to about 50 percent conversion) is achieved by increasing the amount of the polyisocyanate; or (iv) at a given reaction temperature and given amounts of the polyepoxide compound, polyisocyanate compound and catalyst, higher conversion of the isocyanate groups to isocyanurate rings (up to about 50 percent conversion) is achieved by increasing the rate of addition of the polyisocyanate compound.

The relation between the various reaction parameters influencing conversion of isocyanate groups into oxazolidone rings can be expressed as follows:

$$\%\ \text{Oxazolidone} = -3.17i + 0.135c - 2.126t + 8.685r + 0.0142t^2 - 0.184r^2$$

wherein i is weight percent of polyisocyanate, c is amount of catalyst (in ppm), t is reaction temperature (°C.) and r is addition time of polyisocyanate (in min.).

Using the above equation, reaction parameters can be selected and the reaction conducted so as to obtain an epoxy-terminated polyoxazolidone having the desired content of oxazolidone rings (a margin of error: ±15 percent).

It should be understood that if the number obtained in the above equation is 100 or greater it represents 100 percent conversion of isocyanate groups into oxazolidone rings.

The process of the present invention provides for the preparation of the epoxy-terminated polyoxazolidone which have specific properties linked to the particular ratio of oxazolidone and isocyanurate rings.

The epoxy-terminated polyoxazolidones prepared according to the process of the present invention, when cured, are found to have unexpectedly high glass transition temperatures (up to about 175° C. and higher) and surprisingly high solvent resistance properties (for example N-methylpyrrolidone pick-up of less than about 0.05 percent). The epoxy-terminated polyoxazolidones of the present invention, when cured, consistently have glass transition temperatures greater than about 135° C. and N-methylpyrrolidone pick-up of less than about 0.5 percent. These properties make the epoxy-terminated polyoxazolidones of the present invention particularly advantageous for use in the electrical laminate applications, especially printed circuit board uses, in which high glass transition temperatures and high solvent resistance properties are highly sought after properties in the materials.

Laminates used in the preparation of electrical circuit boards, have been conventionally produced by impregnating a supporting or reinforcing web with a resin composition, by passing the impregnated mat through a heated chamber where the resin composition is partially cured and laminating one or more layers of the resin mat with a layer such as copper foil under the application of heat and pressure. The resin composition employed for impregnating, in general, is referred to as "varnish", and the impregnated resin mat, conventionally, is referred to as "prepreg". The electrical laminate, is processed into circuit boards in known manner.

A typical epoxy resin composition for the electrical laminating applications comprises a brominated epoxy resin prepared from a diglycidyl ethers of bisphenol A and a tetrabromobisphenol A, dicyandiamide as a hardener, an organic solvent such as acetone, and an accelerator. Unfortunately, the glass transition temperature of a cured epoxy resin prepared from this varnish composition is undesirably low, for example from about 110° C. to about 135° C. which causes problems in the subsequent processing steps used to prepare the printed circuit boards.

An alternative varnish composition for application to a reinforcing web used in the production of electrical laminates, comprises a blend of a diglycidyl ether of bisphenol A and either bisphenol or tetrabromobisphenol A and a dicyandiamide as a hardener. The diglycidyl ether of bisphenol A is reacted in situ with bisphenol A and/or tetrabromobisphenol A and dicyandiamide during impregnation of the reinforcing web and the partial cure of the resin (see for example U.S. Pat. No. 3,738,862). Unfortunately, this varnish composition also exhibit undesirably low glass transition temperatures (less than 135° C.).

The present invention solves the problem experienced in the art by providing an epoxy resin varnish composition comprising an epoxy resin, a hardener, an organic solvent, an accelerator and, optionally, another standard adjuncts characterized in that the epoxy resin is the epoxy-terminated polyoxazolidone having the isocyanate content of from about 5 to about 30 weight percent and having from about 50 to about 100 percent of the isocyanate groups converted to oxazolidone rings and from about 0 to about 50 percent of the isocyanate groups converted to isocyanurate rings.

The epoxy-terminated oxazolidones are prepared according to the process described hereinbefore.

When cured, the epoxy resin varnish compositions of the present invention exhibit surprisingly excellent physical and mechanical properties. In particular the cured epoxy-terminated polyoxazolidones exhibit substantially higher glass transition temperatures, for example, about 175° C. and higher, than the conventional epoxy resins cured with dicyandiamide. In addition, the cured epoxy-terminated polyoxazolidone exhibit surprisingly high resistance to attack by various chemicals as demonstrated by the N-methylpyrrolidone pick-up of less than about 0.1 percent.

The organic solvents suitably employed for the epoxy resin varnish compositions of the present invention are those organic liquids in which the epoxy-terminated polyoxazolidone and the hardener are soluble and which are sufficiently volatile such that they escape from the varnish composition before and/or during the partial cure and/or before the final cure. Illustrative examples of such organic liquids are various glycol ethers such as ethylene or propylene glycol monomethylether and the esters thereof such as ethylene glycol monomethylether acetate; ketones such as methylisobutyl ketone, methylethyl ketone, acetone and methylisopropyl ketone; and aromatic hydrocarbons such as toluene and xylene or mixtures thereof. Of such organic liquids, those preferably used as the solvent in the epoxy resin composition of the present invention are the ketones, particularly acetone, methyl ethyl ketone and methyl isobutyl ketone, or mixtures of these ketones with each other or with one or more of the other solvents. Other solvents that can be used are dimethyl sulfoxide (DMSO), N-methylpyrrolidone and dimethylformamide.

The amount of solvent most advantageously employed in the varnish composition of the present invention will vary depending on a variety of factors including the particular solvent, hardener and epoxy resin employed, desired properties of the epoxy resin composition (for example, desired viscosity of the varnish composition and the desired resin "pick-up" of this composition by the reinforcing web). Advantageously, the composition exhibits a viscosity from about 50 to about 1000 milliPascal seconds (mPa.s) measured using a Brookfield viscometer, Type RVT, 20 rpm and the appropriate spindle at 25° C. In general, the amount of solvent will range from about 20 to about 60, preferably from about 25 to about 50 weight percent, based on the total weight of the varnish composition, the remainder comprising non-volatiles components (amount of the total solids other than the solvents). More preferably, the epoxy composition will contain from about 20 to about 45 weight percent of the solvent and from about 55 to about 80 weight percent non-volatiles.

The hardener useful in the present invention is capable of curing the epoxy-terminated polyoxazolidone and is soluble in the solvent employed. The hardener useful in the epoxy resin varnish composition of the present invention is suitably dicyandiamide system, bisphenols such as bisphenol A and tetrabromobisphenol A, and multifunctional novolacs.

The amount of the hardener in the epoxy resin varnish composition of the present invention is dependent on a variety of factors including the specific hardener and the epoxy resin employed and the desired properties of the varnish composition. In general, the amount of the hardener is selected to give the cured epoxy-terminated polyoxazolidone composition the maximum glass transition temperature. Conveniently, from about 1 to about 8, preferably from about 2 to about 6, most preferably from about 3 to about 5, phr of the dicyandiamide system are employed in the present invention. In general, the polyhydric phenolic hardener is employed in amounts such that the epoxy resin varnish composition comprises from about 0.5 to about 1.5 preferably from about 0.75 to about 1.2, most preferably from about 0.9 to about 1.1, phenolic hydroxyl groups per epoxy group.

The epoxy resin varnish compositions of the present invention will also contain an accelerator. Illustrative examples of accelerators include the stannous salts of monocarboxylic acids, such as stannous octoate and stannous laurate, various alkali metal salts such as lithium benzoate, certain heterocyclic compounds such as the imidazole and benzimidazole compounds and salts thereof, tertiary amine borates and tertiary amines. Preferred accelerators are the benzyldimethylamine and imidazoles, particularly the alkyl-substituted imidazole and phenyl-substituted imidazoles. The most preferred accelerators are 2-methyl imidazole and 2-phenyl imidazole. Additional accelerators that can be used in the present invention are described in U.S. Pat. No. 3,738,862 (Klarquist et al).

In general, if employed, the accelerator is used in an amount sufficient to catalyze the reaction. The accelerator is generally used in amounts of from about 0.01 to about 2 weight percent based on the combined weight of the epoxy resin and hardener. Preferably, the accelerator is employed in an amount of from about 0.02 to about 1 weight percent based on the combined weight of the epoxy resin and hardner.

The epoxy resin varnish compositions can optionally contain adjuncts such as pigments, fillers, dyes and the like. The adjuncts employed in the practice of the present invention are well-known in the art and reference is made thereto for the purpose of this invention.

The epoxy resin varnish compositions of the present invention are particularly useful in impregnating weaves, webs, fabric and cloth of variety of different materials including glass, quartz and synthetic fibers such as aramid. In the preparation of electrical laminates, a glass web is conventionally employed.

In the process of the present invention for preparing electrical laminates, the varnish composition is applied to the reinforcing web in a desired amount and the web subsequently heated to advance and/or cure the epoxy-terminated polyoxazolidone. Although the amounts of the epoxy resin varnish composition which are applied to the reinforcing web will vary depending on the specific web and epoxy resin varnish composition employed and the desire properties of the impregnated cloth and electrical laminates prepared therefrom, the epoxy resin varnish composition of the present invention is generally applied to the reinforcing web in conventional amounts; which amounts vary from about 30 to about 70 weight percent, based on the total weight of the impregnated web.

The impregnated web or prepreg is subsequently processed using conventional techniques. Such techniques involve advancing and/or curing the epoxy resin by heating the impregnated web to an elevated temperature such as from about 100° C. to about 200° C. Subsequently, the prepreg is fabricated into laminates by laminating one or more prepregs, commonly cut to a predetermined size, with thin layers of an electrical conductive material such as copper foil using elevated temperatures and pressures. Conventionally, the laminating temperature vary from about 130° C. to about 230° C., with pressures varying from about 34 kPa to about 6.9 MPa.

The present invention is further illustrated by the following examples in which the formation of oxazolidone and isocyanurate rings is confirmed by infrared (IR) spectrum. The percent conversions of isocyanate groups to oxazolidone and isocyanurate rings is calculated from the relative intensities of oxazolidone and isocyanurate IR bands.

Various terms and designations used in the examples are explained hereinbelow.

Epoxy Resin A stands for a diglycidyl ether of bisphenol A having an epoxy equivalent weight between 177 and 189 sold by The Dow Chemical Company under the trademark D.E.R. 330.

Epoxy resin B stands for an epoxidized phenolformaldehyde novolac resin having an EEW between 176 and 181 with functionality of 3.6 sold by The Dow Chemical Company under the trademark D.E.N. 438.

Epoxy resin C stands for a diglycidyl ether of tetrabromobisphenol A having an EEW between 325 and 375 sold by The Dow Chemical Company under the trademark D.E.R. 542.

Epoxy resin D stands for triglycidyl ether of this (hydroxyphenyl)methane having an EEW between 145 and 175 sold by The Dow Chemical Company under the trademark TACTIX 742.

Epoxy resin E stands for diglycidyl ether of bisphenol A having an EEW of 400–475 sold by The Dow Chemical Company under the trademark D.E.R. 652 A75.

Epoxy resin F stands for brominated bisphenolic epoxy resin having an EEW of 480 to 560 and bromine content of 20.5 to 22.5 weight percent, sold by The Dow Chemical Company under the trademark D.E.R. 512 A75.

TBBA stands for tetrabromobisphenol A.

TDI stands for toluenediisocyanate

Isocyanate A stands for MDI sold by The Dow Chemical Company under the trademark ISONATE M 143.

Isocyanate B stands for polymeric MDI sold by The Dow Chemical Company under the trademark VORANATE M 220.

Isocyanate C stands for 20/80 isomer mixture of TDI.

DICY stands for dicyandiamide.

NMP stands for N-methylpyrrolidone.

The following analytical methods are used for various measurements in the examples.

The standard wet titration method was used to determine Epoxy Equivalent Weight.

The solids content was calculated from the difference of weight of a sample (approximately 1 g) before and after heating in an aluminium dish on a hot plate at 150° C. for an hour and then for a further hour in a vacuum oven at 150° C.

The viscosity of the resin was measured according to ASTM D445 method using a Cannon Fenske Viscometer at 25° C. Reactivity of the resins was measured according to the following method: The resin solution was blended with 0.1 phr 2-methylimidazole based on solid. 2-methylimidazole was first dissolved in acetone to form a 10 percent solution. The mixture was then reacted on the surface of a hot plate held at 175° C. The reactivity was reported as elapsed time required for gelation.

The glass transition temperature was measured on film prepared from the varnish formulation used for reactivity measurement. The film were cured on a hot plate at 175° C. for 90 min. Samples were run at 10° C/min. from 38° C. using a METTLER TA TM 2000 DTA.

The glass transition temperature of the laminate was measured directly on the cured laminate according to the method for measuring glass transition temperature on film.

The melt viscosity was measured according to the ASTM D445 method using an ICI cone and plate viscosimeter.

To measure the chemical resistance, three pieces of etched laminates 6 cm×1.5 cm were cut, weighed and dipped for 30 minutes in N-methylpyrrolidone solvent at 23° C. The pieces were dried and then weighed; the solvent pick up was taken as the gain in weight.

To measure the moisture resistance, twelve pieces of etched laminates 6 cm×1.5 cm were placed in a pressure cooker in water for 30, 60 or 90 minutes at 120° C. Then, after being dried were dipped (20 seconds) in a tin solder bath (260° C.), to determine resistance to blistering due to moisture absorption.

The binding strength between the copper and the epoxy resin was determine through the strength needed to peel off the copper from a laminate.

The volatile determination of the prepreg was done as follows:

A sample of prepreg approximately 10 cm×10 cm was weighed to the nearest 0.001 gram ($W_1$). The sample is placed in a circulating air oven at 163° C. for 15 minutes and on removal it was placed immediately in a desiccator to cool. When cooled, the sample was reweighed and the weight recorded as $W_2$. The volatile content is calculated from:

$$\% \text{ volatiles} = \frac{(W_1 - W_2) \cdot 100}{W_1}$$

In the following examples, all parts and percentages are by weight unless otherwise expressly indicated.

PREPARATION OF THE EPOXY-TERMINATED POLYOXAZOLIDONES

EXAMPLE 1

10% Polyisocyanate/90% Epoxy Resin

To a 1000 ml 3-neck flask equipped with pneumatic stirrer water cooled condenser, inlet for nitrogen padding, a thermocouple, temperature controller, heating mantle and an attached addition funnel, was added Epoxy Resin A (450 g; EEW=180). The flask was heated up to about 145° C. to 150° C. while stirring and was padded with nitrogen. 2-Methylimidazole (0.15 g; 0.03 percent) was then added to the flask and the resultant mixture was heated to 160° C. At that time, of Isocyanate A (50 g) was placed in the addition funnel. Isocyanate was added dropwise to the mixture of Epoxy Resin A and 2-methylimidazole at 160° C. within a period of 30 minutes. The reaction mixture was maintained at a temperature of 160° C. for additional 15 minutes after completion of the addition of Isocyanate A.

The IR spectrum of the sample of the product showed the presence of the characteristic absorption band of oxazolidone J (C=O) at 1755 $cm^{-1}$. The characteristic absorption bands of isocyanate J (C=O) at 2250 to 2270 $cm^{-1}$ and isocyanurate J (C=O) at 1700 $cm^{-1}$ were not present. This indicates 100 percent conversion of isocyanate groups into oxazolidone rings.

The obtained epoxy-terminated polyoxazolidone has an EEW of 222 and viscosity of 600 mPa.s at 80° C. This product is referred to as Resin 1 hereinafter.

EXAMPLE 2

20% Polyisocyanate/80% Epoxy Resin

To a 100 ml 3-neck flask equipped as in Example 1, was added Epoxy Resin A (400 g; EEW=180). The flask was heated to about 135° C. to 140° C. while stirring and was padded with nitrogen. 2-Phenylimidazole (0.11 g; 0.022 percent) was added to the flask and the resultant mixture heated to 150° C. Then, Isocyanate A (100 g) was placed in the addition funnel and added dropwise to the flask within a period of time of 30 minutes while maintaining the reaction temperature at 150° C. Samples were taken periodically after the end of addition of Isocyanate A and analyzed by titrating for residual epoxide and by infrared analysis.

The IR spectrum of the sample of the product taken at 60 minutes after the end of the addition of Isocyanate A showed the presence of characteristic absorption bands of oxazolidone J(C=O) at 1753 $cm^{-1}$ and of isocyanurate J(C=O) at 1709 $cm^{-1}$ with approximately the same absorption intensities. The isocyanate band was not present, which indicates that about 50 percent of isocyanate groups was converted to oxazolidone rings and 50 percent was converted to isocyanurate rings.

The obtained epoxy-terminated polyoxazolidone is a solid at 25° C., has an EEW of 253 and viscosity of 460 mPa.s at 150° C. This product is referred to as Resin 2 hereinafter.

EXAMPLE 3

9.4% Polyisocyanate/90.6% Epoxy Resin Advanced with Bisphenol A

A. To a flask equipped as in Example 1 was added 532 g of Epoxy Resin A (EEW=180). While stirring, the flask was heated to about 85° C. to 90° C. and padded with nitrogen. At about 90° C., 1.89 of tetraphenylphosphonium bromide was added to the flask and the resultant mixture heated to about 150° C. Then, 64.7 g of Isocyanate A was placed in the addition funnel and added dropwise to the flask within a period of 3 minutes. The temperature of the reaction mixture was raised by exothermic reaction to about 195° C. Approximately 10 minutes after the end of addition of Isocyanate A, a sample was taken and analyzed by titrating for residual epoxide, and by infrared analysis. The product obtained is a semi-solid at room temperature. This product has an EEW of 234 and melt viscosity of 9280 mPa.s at 60° C.

B. The above semi-solid product (254.8 g) was added to another flask and heated to about 85° C. to 90° C. and the flask padded with nitrogen. At about 90° C., bisphenol A (40.5 g) was added to the flask while stirring and the temperature of the reaction mixture raised by the exothermic reaction to about 187° C. A sample was taken 45 minutes after the addition of bisphenol A and titrated. The reaction was complete and the EEW of the product advanced in molecular weight is 416. This product is referred to as Resin 3 hereinafter.

EXAMPLE 4

30% Polyisocyanate/70% Epoxy Resin

To a flask equipped as in Example 1 was added 350 g of Epoxy Resin A (EEW=180). While stirring, the flask was heated to about 165° C. to 170° C. and padded with nitrogen. At about 170° C., 0.25 g (0.05 percent) of 2-phenylimidazole was added to the flask and the resultant mixture heated to 180° C. Then, 150 g of Isocyanate A was added dropwise to the mixture during a period of 45 minutes while the reaction temperature increased from 180° C. to 190° C. Samples were taken periodically and analyzed by tritration and infrared spectroscopy. The reaction mixture was maintained at 180° C. for additional 60 minutes.

The IR spectrum of the sample taken 60 minutes after the end of addition of Isocyanate A showed the presence of the characteristic absorption band of oxazolidone J(C═O) at 1752 $cm^{-1}$. The characteristic band of isocyanate and isocyanurate were not present.

This product is a solid material at room temperature and has an EEW of 588. The product is referred to as Resin 4 hereinafter.

EXAMPLE 5

20% Polyisocyanate/80% Epoxy Resin

To a flask equipped as in Example 1 was added 400 g of Epoxy Resin A (EEW=180). While stirring the content, the flask was heated to about 145° C. to 150° C. and padded with nitrogen. 2-Phenylimidazole (0.175 g; 0.035 percent) was added to the flask and the resultant mixture heated to 160° C. Then, Isocyanate A (100 g) was added dropwise to the mixture within a period of 45 minutes. The temperature was raised by the exothermic reaction to about 180° C. to 185° C. Sample of the product was taken 15 minutes after the end of addition of Isocyanate A and analyzed by titrating for residual epoxide and infrared spectroscopy. The characteristic absorption band of oxazolidone J(C═O) at 1750 $cm^{-1}$ was present. The isocyanate and isocyanurate absorption bands were not present. This indicates 100 percent conversion of isocyanate groups to oxazolidone rings. The product obtained is a solid at room temperature and has an EEW of 330 and viscosity of 580 mPa.s at 150° C. This product is referred to as Resin 5 hereinafter.

EXAMPLE 6

14% Polyisocyanate/86% Epoxy Resin

To a flask equipped as in Example 1 were added Epoxy Resin A (245 g) and Epoxy Resin C (185 g). While stirring the content, the flask was heated to about 145° C. to 150° C. and padded with nitrogen. 2-phenylimidazole (0.2 g dissolved in 0.2 g methanol) was added to the flask and the resultant mixture heated to about 155° C. Then, Isocyanate B (70 g) was added dropwise to the mixture within a period of 30 minutes. The temperature of the reaction mixture was raised by the exothermic reaction to about 175° C. to 180° C. A sample of the product was taken 30 minutes after the end of the addition of Isocyanate B and analyzed by titrating for residual epoxide and infrared spectroscopy. The infrared spectroscopy showed the presence of oxazolidone band J(C═O) at 1752 $cm^{-1}$. No isocyanate and isocyanurate bands were present. This indicates 100 percent conversion of isocyanate groups to oxazolidone rings.

The product obtained is a solid at room temperature and has an EEW of 356 and viscosity of 900 mPa.s at 150° C. This product is referred to as Resin 6 hereinafter.

EXAMPLE 7

7.5% Polyisocyanate/92.5% Epoxy Resin Advanced with TBBA (A) To a flask equipped as in Example 1 was added Epoxy Resin A (307.6 g; EEW=177) and the flask was heated to about 135° C. to 140° C. and padded with nitrogen while the content was stirred. 2-Ethyl-4-methylimidazole (0.276 g; 0.08 percent) was added to the flask and the resultant mixture heated to about 145° C. Then, Isocyanate A (37.4 g) was added dropwise to the mixture within a period of 25 minutes. The temperature of the reaction mixture was kept at 160° C. The reaction temperature was kept at 160° C. and 20 minutes after the end of the Isocyanate A addition a sample of the product was taken and analyzed by titrating for residual epoxide and by infrared spectroscopy. This product is a semi-solid at room temperature and has an EEW of 224.

(B) While the reaction temperature was kept at 160° C., tetrabromobisphenol A (155 g) was added to the flask containing the product of above paragraph for the advancement in molecular weight of the product. The reaction temperature was then lowered to 150° C. and the advancement reaction continued at that temperature for about 30 minutes. The advanced product has an EEW of 567. This product is referred to as Resin 7 hereinafter.

EXAMPLE 8

19% Polyisocyanate/81% Epoxy Resin

To a flask equipped as in Example 1 was added Epoxy Resin A (405 g; EEW=177). While stirring the content the flask was heated to about 145° C. and padded with nitrogen. 2-Phenylimidazole (0.175 g; 0.035 percent) was then added to the flask and the resultant mixture heated to about 155° C. Isocyanate B (95 g) was added dropwise to the mixture within a period of 30 minutes. A sample of the product was taken 60 minutes after the end of the Isocyanate B addition and analyzed by titration for residual epoxide and by infrared spectroscopy. The characteristic absorption band of oxazolidone J(C═O) at 1752 $cm^{-1}$ was present. The isocyanate and isocyanurate absorption bands were not present. This indicates 100 percent conversion of isocyanate groups to oxazolidone groups. The product obtained has an EEW of 320 and melt viscosity of 840 mPa.s at 150° C.

EXAMPLE 9

7.5% Polyisocyanate/92.5% Epoxy Resin

To a flask equipped as in Example 1 was added Epoxy Resin C (4625 g; EEW=330). While stirring the content, the flask was heated to about 150° C. and padded with nitrogen. 2-Phenylimidazole (0.25 g/0.05 percent) was then added to the flask and the resultant mixture heated to about 160° C. Then, Isocyanate B (37.5 g) was added dropwise to the mixture within a period of 30 minutes. A sample of the product was taken 60 minutes after the end of Isocyanate B addition and analyzed by titrating for residual epoxide and by infrared spectroscopy. The characteristic absorption band of oxazolidone J(C═O) at 1752 $cm^{-1}$ was present. The isocyanate and isocyanurate bands were not present. This indicates 100 percent conversion of isocyanate groups to oxazolidone rings. The product obtained has an EEW of 440 and melt viscosity of 920 mPa.s at 150° C.

EXAMPLE 10

10% Polyisocyanate/90% Epoxy Resin

To a flask equipped as in Example 1 was added Epoxy Resin D (450 g; EEW=160). While stirring the content, the flask was heated to about 150° C. and padded with nitrogen. 2-Phenylimidazole (0.175 g/0.035 percent) was then added to the flask and the resultant mixture heated to about 160° C. Then, Isocyanate A (50 g) was added dropwise to the mixture within a period of 30 minutes and the reaction temperature maintained at 160° C. after the end of the Isocyanate addition for 60 minutes. At that time a sample of the product was taken and analyzed by titrating for residual epoxide and by infrared spectroscopy. The characterized absorption band of oxazolidone J(C═O) at 1752 cm−was present. The absence of isocyanate and isocyanurate bands indicates 100 percent conversion of isocyanate groups to oxazolidone rings.

EXAMPLE 11

15% TDI/85% Epoxy Resin

To a 1000 ml 3-neck flask equipped with pneumatic stirrer water cooled condenser, inlet for nitrogen padding, a thermocouple, temperature controller, heating mantle and an attached addition funnel, was added Epoxy Resin A (425 g; EEW=180). The flask was heated up to about 150° C. while stirring and was padded with nitrogen. 2-Phenylimidazole (0.15 g; 0.03 percent) was then added to the flask and the resultant mixture was heated to 160° C. At that time, of Isocyanate C (75 g) was placed in the addition funnel. Isocyanate was added dropwise to the mixture of Epoxy Resin A and 2-phenylimidazole at 160° C. within a period of 30 minutes. The reaction mixture was maintained at a temperature of 160° C. for additional 60 minutes after completion of the addition of Isocyanate C.

The IR spectrum of the sample of the product taken at 60 minutes after the end of the addition of Isocyanate C showed the presence of characteristic absorption bands of oxazolidone J(C═O) at 1753 $cm^{-1}$ and of isocyanurate J(C═O) at 1709 $cm^{-1}$ with approximately a ratio 85/15 absorption intensity. The isocyanate band was not present, which indicates that about 85 percent of isocyanate groups was converted to oxazolidone rings and 15 percent was converted to isocyanurate rings.

The obtained epoxy-terminated polyoxazolidone is a solid at 25° C., has an EEW of 315 and viscosity of 440 mPa.s at 150° C. This product is referred to as Resin 11 hereinafter.

EXAMPLE 12

10% Polyisocyanate/90% Epoxy Resin

To a 1000 ml 3-neck flask equipped with pneumatic stirrer water cooled condenser, inlet for nitrogen padding, a thermocouple, temperature controller, heating mantle and an attached addition funnel, was added Epoxy Resin A (450 g; EEW=177). The flask was heated up to about 130° C. while stirring and was padded with nitrogen. 2-Phenylimidazole (0.15 g; 0.03 percent) was then added to the flask and the resultant mixture was heated to 140° C. At that time, of Isocyanate A (50 g) was placed in the addition funnel. Isocyanate was added dropwise to the mixture of Epoxy Resin A and 2-phenylimidazole at 140° C. within a period of 30 minutes. The reaction mixture was maintained at a temperature of 140° C. for additional 15 minutes after completion of the addition of Isocyanate A.

The IR spectrum of the sample of the product showed the presence of the characteristic absorption band of oxazolidone J (C═O) at 1755 $cm^{-1}$. The characteristic absorption bands of isocyanate J (C═O) at 2250 to 2270 $cm^{-1}$ and isocyanurate J (C═O) at 1700 $cm^{-1}$ were not present. This indicates 100 percent conversion of isocyanate groups into oxazolidone rings.

The obtained epoxy-terminated polyoxazolidone has an EEW of 288 and viscosity of 600 mPa.s at 80° C. This product is referred to as Resin 12 hereinafter.

EXAMPLE 13

10% Polyisocyanate/90% Epoxy Resin

The reaction conditions were the same as Example 12, except the amounts of 2-phenylimidzole used was (0.075 g; 0.015 percent). The reaction mixture was maintained at a temperature of 140° C. for additional 120 minutes after completion of the addition of Isocyanate A.

The IR spectrum of the sample of the product taken at 120 minutes after the end of the addition of Isocyanate A showed the presence of characteristic absorption bands of oxazolidone J(C═O) at 1753 $cm^{-1}$ and of isocyanurate J(C═O) at 1709 $cm^{-1}$ with approximately the same absorption intensities. The isocyanate band was not present, which indicates that about 50 percent of isocyanate groups was converted to oxazolidone rings and 50 percent was converted to isocyanurate rings.

The obtained epoxy-terminated polyoxazolidone is a semi-solid at 25° C., has an EEW of 204 and viscosity of 610 mPa.s at 80° C. This product is referred to as Resin 12 hereinafter.

EXAMPLE 14

10% Polyisocyanate/90% Epoxy Resin

The reaction conditions were the same as Example 12, except the Isocyanate A was added dropwise to the mixture of Epoxy Resin A and 2-phenylimidazole at 140° C. within a period of 10 minutes (instead of 30 minutes). The reaction mixture was maintained at a temperature of 140° C. for additional 60 minutes after completion of the addition of Isocyanate A.

The IR spectrum of the sample of the product taken at 60 minutes after the end of the addition of Isocyanate A showed the presence of characteristic absorption bands of oxazolidone J(C═O) at 1754 $cm^{-1}$ and of isocyanurate J(C═O) at 1708 $cm^{-1}$ with approximately the same absorption intensities. The isocyanate band was not present, which indicates that about 50 percent of isocyanate groups was converted to oxazolidone rings and 50 percent was converted to isocyanurate rings.

The obtained epoxy-terminated polyoxazolidone is a semi-solid at 25° C., has an EEW of 212 and viscosity of 1960 mPa.s at 80° C. This product is referred to as Resin 14 hereinafter.

EXAMPLE 15

15% Polyisocyanate/85% Epoxy Resin

To a 1000 ml 3-neck flask equipped with pneumatic stirrer water cooled condenser, inlet for nitrogen padding, a thermocouple, temperature controller, heating mantle and an attached addition funnel, was added Epoxy Resin A (425 g: EEW=180). The flask was heated up to about 150° C. while stirring and was padded with nitrogen. 2-Phenylimidazole (0.15 g; 0.03 percent) was then added to the flask and the resultant mixture was heated to 160° C. At that time, of Isocyanate A (75 g) was placed in the addition funnel. Isocyanate was added dropwise to the mixture of Epoxy Resin A and 2-phenylimidazole at 160° C. within a period of 30 minutes. The reaction mixture was maintained at a temperature of 160° C. for additional 15 minutes after completion of the addition of Isocyanate A.

The IR spectrum of the sample of the product showed the presence of the characteristic absorption band of oxazolidone J (C═O) at 1755 $cm^{-1}$. The characteristic absorption bands of isocyanate J (C═O) at 2250 to 2270 $cm^{-1}$ and isocyanurate J (C═O) at 1700 $cm^{-1}$ were not present. This indicates 100 percent conversion of isocyanate groups into oxazolidone rings.

The obtained epoxy-terminated polyoxazolidone has an EEW of 258 and viscosity of 260 mPa.s at 120° C. This product is referred to as Resin 15 hereinafter.

EXAMPLE 16

15% Polyisocyanate/85% Epoxy Resin

To a 1000 ml 3-neck flask equipped with pneumatic stirrer water cooled condenser, inlet for nitrogen padding, a thermocouple, temperature controller, heating mantle and an attached addition funnel, was added Epoxy Resin A (425 g; EEW=180). The flask was heated up to about 130° C. while stirring and was padded with nitrogen. 2-Phenylimidazole (0.15 g; 0.03 percent) was then added to the flask and the resultant mixture was heated to 160° C. At that time, of Isocyanate A (75 g) was placed in the addition funnel. Isocyanate was added dropwise to the mixture of Epoxy Resin A and 2-phenylimidazole at 140° C. within a period of 30 minutes. The reaction mixture was maintained at a temperature of 140° C. for additional 60 minutes after completion of the addition of Isocyanate A.

The IR spectrum of the sample of the product taken at 60 minutes after the end of the addition of Isocyanate A showed the presence of characteristic absorption bands of oxazolidone J(C═O) at 1754 $cm^{-1}$ and of isocyanurate J(C═O) at 1707 $cm^{-1}$ with approximately the same absorption intensities. The isocyanate band was not present, which indicates that about 55 percent of isocyanate groups was converted to oxazolidone rings and 45 percent was converted to isocyanurate rings.

The obtained epoxy-terminated polyoxazolidone has an EEW of 234 and viscosity of 330 mPa.s at 120° C. This product is referred to as Resin 16 hereinafter.

EXAMPLE 17

20% Polyisocyanat/80% Epoxy Resin

To a 100 ml 3-neck flask equipped as in Example 1, was added Epoxy Resin A (400 g; EEW=180). The flask was heated to about 150° C. while stirring and was padded with nitrogen. 2-Phenylimidazole (0.15 g; 0.03 percent) was added to the flask and the resultant mixture heated to 160° C. Then, Isocyanate A (100 g) was placed in the addition funnel and added dropwise to the flask within a period of time of 30 minutes while maintaining the reaction temperature at 160° C. Samples were taken periodically after the end of addition of Isocyanate A and analyzed by titrating for residual epoxide and by infrared analysis.

The IR spectrum of the sample of the product taken at 60 minutes after the end of the addition of Isocyanate A showed the presence of characteristic absorption bands of oxazolidone J(C═O) at 1753 $cm^{-1}$ and of isocyanurate J(C═O) at 1709 $cm^{-1}$ with approximately a ratio of 70/30 absorption intensity. The isocyanate band was not present, which indicates that about 70 percent of isocyanate groups was converted to oxazolidone rings and 30 percent was converted to isocyanurate rings.

The obtained epoxy-terminated polyoxazolidone is a solid at 25° C., has an EEW of 284 and viscosity of 280 mPa.s at 150° C. This product is referred to as Resin 17 hereinafter.

EXAMPLE 18

15% Polyisocyanate/85% Epoxy Resin

To a 100 ml 3-neck flask equipped as in Example 1, was added Epoxy Resin A (400 g; EEW=180) and Epoxy Resin B (25 g; EEW 185). The flask was heated to about 150° C. while stirring and was padded with nitrogen. 2-Phenylimidazole (0.1 g; 0.02 percent) was added to the flask and the resultant mixture heated to 160° C. Then, Isocyanate A (75 g) was placed in the addition funnel and added dropwise to the flask within a period of time of 30 minutes while maintaining the reaction temperature at 160° C. Sample was taken 60 minutes after the end of addition of Isocyanate A and analyzed by titrating for residual epoxide and by infrared analysis.

The IR spectrum of the sample of the product showed the presence of the characteristic absorption band of oxazolidone J (C═O) at 1755 $cm^{-1}$. The characteristic absorption bands of isocyanate J (C═O) at 2250–2270 $cm^{-1}$ and isocyanurate J (C=O) at 1700 $cm^{-1}$ were not present. This indicates 100 percent conversion of isocyanate groups into oxazolidone rings.

The obtained epoxy-terminated polyoxazolidone has an EEW of 263 and viscosity of 50 mPa.s at 150° C. This product is referred to as Resin 18 hereinafter.

Preparation of Varnishes and Laminates

Using procedures described in the Examples hereinbefore, Resins 1 to 7 and 9 were prepared in larger quantities in a 10 liter stainless steel reaction. After the completion of the reactions which was indicated by the absence of the isocyanate band in the IR spectra of the samples taken, each reaction mixture was cooled to about 130° C. and diluted with methylethylketone to give a solution of from 70 to 80 percent solids content.

Epoxy Resin varnishes are prepared by mixing solution of an epoxy-terminated polyoxazolidone of this invention, a hardener, a solvent and an accelerator at room temperature in a container equipped with a stirrer according to the proportions (based on solid resins) indicated in Table 1 below. Approximately 15 kg of each Epoxy Resin Varnish were prepared.

The resulting varnishes were used to impregnate a glass cloth (Marglass 7628 finish 782). This cloth is an industrial glass silk fabric having equal warp and weft (plain weave) of electrical grade glass treated with finish 782. The glass silk fabric was impregnated with the varnish on the horizontal pilot plant size Caratsch treater.

The varnish was applied to a glass silk fabric by pulling the glass silk fabric through a resin bath containing the varnish and then through a doctor bar set at about 0.5 to 1.3 mm and then through three air heated zones to a temperature of from 150° C. to 170° C. The total length of all three heating zones was 3 meters. The glass silk fabric passed through the resin bath and heating zones at a rate of 0.5 to 2.5 m/min.

The treater parameters were adjusted to produce prepreg with the following characteristics:

| | | Test method |
|---|---|---|
| Rest gel time at 175° C. | 100–200 sec | NEMA LI 1-12.19 |
| Flow at 170° C. | 12–20% | NEMA LI 1-14.32 |
| Volatile | <1% | |
| Resin content | 40–44% | NEMA LI 1-12.16 |

except for Examples III and XII, in which the parameters were adjusted to produce the following characteristics:

Rest gel time at 170° C.—60–100 sec

Flow at 170° C.—10–25%

The prepregs were then fabricated into "FR-4" and "G-10" type electrical laminates by placing 8 plies of prepreg between 2 sheets of copper foil and pressing in a laboratory press (LAUFFER) following the press cycle:

0–30 min. low pressure (14 kg/$cm^2$) R.T. to 170° C.

30–120 min. high pressure (45 kg/$cm^2$) at 170° C.

120–150 min. cooling (by water) 170° C. to R.T.

The press was loaded at room temperature.

Composition of the epoxy resin varnishes and various physical and mechanical properties of the cured resins, prepregs and laminates are set out in Table I below.

TABLE I

COMPOSITIONS - CURED RESINS, PREPREGS AND LAMINATES PROPERTIES

| Varnish and Laminate Examples | I | II | III | IV | V | VI | VII | VIII | IX | X | XI | XII (2) |
|---|---|---|---|---|---|---|---|---|---|---|---|---|
| VARNISH COMPOSITION (parts by weight) | | | | | | | | | | | | |
| RESINS (parts based on solid) | | | | | | | | | | | | |
| Resin 1 | 80 | | | | | | | | | | | |
| Resin 2 | | | | | 75.9 | | | | | 58.4 | 91.3 | |
| Resin 3 | | | | | | 100 | | | | | | |
| Resin 4 | | 100 | | | | | | | | | | |
| Resin 5 | | | | | | | 100 | 72.4 | 67.4 | | | |
| Resin 6 | | | 100 | | | | | | | | | |
| Resin 7 | | | | 100 | | | | | | | | |
| Resin 9 | | | | | | | | | | | | 100 |
| DER* 542 | | | | | | | | | 32.6 | | | |
| HARDENERS | | | | | | | | | | | | |
| DICY solution (1) | 53.3 | 25 | 50.7 | 28 | 40 | 45.3 | 53.3 | 26.7 | 60 | | 44 | |
| Bisphenol A | | | | | | | | | | | 8.7 | |
| TBBA | | | | | 24.1 | | | 27.6 | | 31 | | |
| **Examples** | **I** | **II** | **III** | **IV** | **V** | **VI** | **VII** | **VIII** | **IX** | **X** | **XI** | **XII** |
| Phenolic Novolac | | | | | | | | | | 10.6 | | |
| CATALYSTS | | | | | | | | | | | | |
| 2-methylimidazole | 0.08 | 0.1 | 0.08 | 0.11 | 0.07 | 0.075 | 0.1 | 0.05 | 0.1 | 0.08 | 0.066 | 0.06 |
| SOLVENTS | | | | | | | | | | | | |
| Methyl-ethyl- | 20 | 67 | 33 | 33.3 | 33.3 | 38.3 | 25 | 33.3 | 33.3 | 33.3 | 25 | 33 |

TABLE I-continued

| COMPOSITIONS - CURED RESINS, PREPREGS AND LAMINATES PROPERTIES | | | | | | | | | | | | |
|---|---|---|---|---|---|---|---|---|---|---|---|---|
| ketone | | | | | | | | | | | | |
| RESIN PROPERTIES | | | | | | | | | | | | |
| Geltime, 175° C., sec. | 256 | 215 | 240 | 205 | 146 | 272 | 230 | 250 | 221 | 218 | 167 | 279 |
| Tg of film, deg C. (cure: 90 min, 175° C.) | 168 | 170 | 175 | 148 | 164 | 139 | 168 | 150 | 175 | 152 | 150 | 193 |
| Viscosity (Ford Cup #4, sec.) | | | 27 | | 34 | 60 | 45 | 56 | 25 | 65 | 41 | 20 |
| PREPREG PROPERTIES | | | | | | | | | | | | |
| % Resin content | | | 42 | | 42.5 | 45 | 41 | 40.5 | 41 | 42 | 41 | 46 |
| % Volatiles | | | 0.1 | | 0.2 | NA | NA | NA | NA | NA | 0.38 | 0.2 |
| Geltime, 175 C., sec. | | | 88 | | 65 | 91 | 103 | 152 | 105 | 103 | 60 | 101 |
| % Flow | | | 16.5 | | 18.7 | NA | 23 | 8.1 | 17.7 | 19.8 | 24.4 | 11.3 |
| LAMINATE PROPERTIES | | | | | | | | | | | | |
| Tg, deg C. | | | 168 | | 164 | 136 | 168 | 149 | 175 | 146 | 147 | 190 |
| Chemical Resistance (% NMP pick-up) | | | 0.1 | | 0.06 | 0.3 | 0.03 | 0.75 | 0.03 | 0.34 | 0.09 | 0.1 |
| Blister Resistance (P.T.C., min.) | | | 120 | | 60 | 60 | 120 | 90 | 120 | 90 | 60 | 120 |
| Copper peel Strength (N/cm.) | | | 15 | | 14.2 | 15 | 14.4 | 18.8 | 14.8 | 13.8 | 12.6 | 14.8 |

(1) DICY solution:
Dicyandiamide 7.5%
Propylene glycol monomethyl ether 69.9%
Dimethylformamide 22.6%
(2) Pressure cycle: RT -
175° C. Low pressure 15 min.
175° C. High pressure 60 min.
175° C. to 30° C. pressure 15 min.

Laminates produced from standard commercial grades of NEMAG-10 (Non Brominated) and NEMA FR-4 (Brominated) resins have properties set out in Table II below.

TABLE II

| Standard Laminate Properties | | |
|---|---|---|
| Laminate Type* | NEMA G-10* | NEMA FR-4* |
| St. Resin Type | Epoxy Resin E* | Epoxy Resin F* |
| Tg °C. | 110 | 127 |
| Chemical Resistance (% NMP Pick-up) | 2.0 | 1.6 |

*Not an example of the present invention.
Note:
The resins are cured according to standard practice in the industry with dicyandiamide.

The data in Table I and Table II clearly demonstrate surprisingly improved properties of the laminates incorporating the epoxy-terminated polyoxazolidones of the present invention, especially the improved heat resistance (Tg) and chemical resistance (percent NMP pick-up) properties.

What is claimed is:

1. A process for the preparation of an epoxy-terminated polyoxazolidone having, when cured, glass transition temperature greater than about 135° C. and N-methylpyrrolidone pick-up of less than about 0.5 percent which process comprises reacting a polyepoxide compound with a polyisocyanate compound in the presence of a catalyst for the reaction of the epoxy and isocyanate groups at an elevated temperature, said process being characterized by (A) adding (1) from about 5 to about 30 weight percent of the polyisocyanate compound within a period of time of from about 3 to about 90 minutes to (2) a mixture comprising (a) from about 70 to about 95 weight percent of the polyepoxide compound and (b) from about 0.01 to about 2 weight percent of the catalyst, said weight percentages being based on the combined weight of the polyepoxide compound and polyisocyanate compound; and (B) heating the reaction mixture obtained in step A to a temperature of from about 110° C. to about 200° C., for a period of time from about 5 to about 180 minutes; so as to obtain an epoxy-terminated polyoxazolidone having from about 50 to about 100 percent of the original isocyanate groups converted to oxazolidone rings and from about 0 to about 50 percent of the original isocyanate groups converted to isocyanurate rings.

2. The process of claim 1 for the preparation of an epoxy-terminated polyoxazolidone, characterized in that in step (A) from about 0.02 to about 1 weight percent of the catalyst is employed.

3. The process of claim 1 for the preparation of an epoxy-terminated polyoxazolidone characterized in that in step (A) from about 0.02 to about 0.1 weight percent of the catalyst is employed.

4. The process of claim 1 characterized in that in step (A) the polyisocyanate compound is added to a mixture of the polyepoxide compound and the catalyst within a period of time of from about 15 to about 60 minutes.

5. The process of claim 4 characterized in that in step (A) the polyisocyanate compound is added to a mixture of the polyepoxide compound and the catalyst within a period of time of from about 20 to about 45 minutes.

6. The process of claim 1 characterized in that in step (B) the reaction mixture is heated to a temperature of from about 120° C. to about 180° C.

7. The process of claim 6 characterized in that in step (B) the reaction mixture is heated to a temperature of from about 140° C. to about 160° C.

8. The process of claim 1 wherein at a given amount of the catalyst and a given amount of the polyisocyanate compound conversion of the isocyanate groups to the oxazolidone and isocyanurate rings is controlled by the reaction temperature used in step (B).

9. The process of claim 1 wherein at a given reaction temperature and a given amount of the polyisocyanate compound conversion of the isocyanate groups to the oxazolidone and isocyanurate rings is controlled by the amount of the catalyst used in step (A).

10. The process of claim 1 wherein at a given amount of the catalyst and a given reaction temperature conversion of the isocyanate groups to the oxazolidone and isocyanurate rings is controlled by the amount of the polyisocyanate compound used in step (A).

11. The process of claim 1 wherein at a given reaction temperature, given amount of the catalyst and given amounts of the polyepoxide and polyisocyanate compounds conversion of the isocyanate groups to the oxazolidone and isocyanurate rings is controlled by the rate of addition of the polyisocyanate compound.

12. The process of claim 1 characterized in that the catalyst used is an imidazole compound or tetraphenylphosphonium bromide.

13. The process of claim 12, characterized in that the imidazole compound is 2-phenylimidazole 2-methylimidazole, 2ethyl-4-methylimidazole, 4,4'-methylene-bis(2-ethyl-5-methylimidazole).

14. An epoxy-terminated polyoxazolidone having an isocyanate content of from about 5 to about 30 weight percent prepared by the process of claim 1.

15. An epoxy-terminated polyoxazolidone of claim 14 characterized in that the polyepoxide used has the following general formula

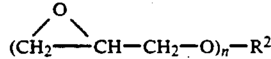

wherein R is substitute or unsubstituted aromatic, aliphatic, cycloaliphatic or heterocyclic polyvalent group and n has an average value of from greater than 1 to less than 5.

16. An epoxy-terminated polyoxazolidone of claim 15 characterized in that the polyepoxide used is diglycidyl ether of 2.2-bis(4-hydroxyphenyl)propane. 2.2-bis(3,5-dibromo-4-hydroxyphenyl)propane or a mixture thereof.

17. An epoxy-terminated polyoxazolidone of claim 14 characterized in that the polyisocyanate compound used has the following general formula

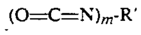

$(O{=}C{=}N)_m\text{-}R'$ wherein R' is substituted or unsubstituted aliphatic, cycloaliphatic, aromatic, or heterocyclic polyvalent group and m has an average value of from greater than 1 to less than 5.

18. An epoxy-terminated polyoxazolidone of claim 16 characterized in that the polyisocyanate is 4,4'-methylene-bis(phenylisocyanate) or an isomer thereof, polymeric MDI or toluene diisocyanate, or a mixture of two or more thereof.

19. An epoxy varnish composition comprising an epoxy resin, a hardener for the epoxy resin, an organic solvent and, optionally an accelerator and other conventional adjuncts, characterized in that the epoxy resin is an epoxy-terminated polyoxazolidone as claimed in anyone of claims 14 to 18.

20. The epoxy resin varnish composition of claim 19, characterized in that the epoxy-terminated polyoxazolidone comprises from about 25 to about 75 weight percent of the varnish composition.

21. The epoxy resin varnish composition of claim 19, characterized in that the epoxy-terminated polyoxazolidone comprises from about 35 to about 65 weight percent of the varnish composition.

22. The epoxy resin varnish composition of claim 19, characterized in that the epoxy-terminated, polyoxazolidone comprises from about 40 to about 60 weight percent of the varnish composition.

23. An epoxy-terminated polyoxazolidone of any one of claims 14 to 16 wherein the polyisocyanate compound used has the following general formula

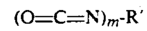

$(O{=}C{=}N)_m\text{-}R'$ wherein R' is substituted or unsubstituted aliphatic, cycloaliphatic, aromatic, or heterocyclic polyvalent group and m has an average value of from 1.5 to 4.

24. An epoxy-terminated polyoxazolidone of any one of claims 14 to 16 wherein the polyisocyanate compound used has the following general formula $(O{=}C{=}N)_m\text{-}R'$ wherein R' is substituted or unsubstituted aliphatic, cycloaliphatic, aromatic, or heterocyclic polyvalent group and m has an average value of from 2 to 3.

* * * * *